(12) United States Patent
Okawa et al.

(10) Patent No.: US 6,815,799 B2
(45) Date of Patent: Nov. 9, 2004

(54) SEMICONDUCTOR INTEGRATED CIRCUIT DEVICE

(75) Inventors: Shigeaki Okawa, Tochigi (JP); Koichiro Ogino, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/437,524

(22) Filed: May 14, 2003

(65) Prior Publication Data

US 2004/0026717 A1 Feb. 12, 2004

(30) Foreign Application Priority Data

Jun. 25, 2002 (JP) ........................................ 2002-184693

(51) Int. Cl.[7] .............................................. H01L 29/00
(52) U.S. Cl. ........................ 257/544; 257/505; 257/606; 257/653
(58) Field of Search .................................. 257/369, 432, 257/446, 505, 539, 544, 555, 563, 565, 582, 605, 606, 653

(56) References Cited

U.S. PATENT DOCUMENTS

2002/0079554 A1 * 6/2002 Okawa et al. .............. 257/565

* cited by examiner

Primary Examiner—Minhloan Tran
Assistant Examiner—Thomas L Dickey
(74) Attorney, Agent, or Firm—Fish & Richardson P.C.

(57) ABSTRACT

A semiconductor integrated circuit device with built-in spark killer diodes suitable for output transistor protection has a problem such that a leakage current to the substrate is great and a desirable forward current cannot be obtained. In a semiconductor integrated circuit device of the present invention, $P^+$-type first and second diffusion regions 34 and 32 are formed on the surface of a second epitaxial layer 23 in a partly overlapping manner. And, by a connection to an anode electrode 39 at a part immediately over the $P^+$-type second diffusion region 32, a parasitic resistance R1 is made greater than a parasitic resistance R2. Thus, an operation of a parasitic transistor TR2 that causes a leakage current to a substrate 21 is suppressed, whereby leakage current can be greatly reduced.

12 Claims, 10 Drawing Sheets

SEMICONDUCTOR INTEGRATED CIRCUIT DEVICE

BACKGROUND OF THE INVENTION

1. Field of the Invention

The present invention relates to a semiconductor integrated circuit with built-in spark killer diodes suitable for output transistor protection.

2. Description of the Prior Art

For example, as a 3-phase motor driver, transistors (Tr1-Tr2, Tr3-Tr4, and Tr5-Tr6) which are connected in series between a direct current VCC and GND are connected in parallel as shown in FIG. 14. And, the 3-phase driver employs a circuit configuration wherein output terminals taken out from the Tr1-Tr2, Tr3-Tr4, and Tr5-Tr6 are connected to a motor M.

In such a case where the load is an inductive load, a forward/counter electromotive force occurs with a rotation/stop of the motor. Priorly, a protection diode is connected between the collector and emitter of series-connected transistors formed in an IC. And, diodes 12 are turned on when the output terminals become lower than the GND potential or higher than the VCC potential due to the counter electromotive force. Thereby, the electromotive force is released to a fixed potential to protect the inside of the IC including the series-connected transistors. In particular, when a large current of as much as several amperes is applied to the diodes 12, discrete components are used as the diodes 12.

Herein, users have a demand that the diodes 12 should also be formed in an IC for a reduction in the number of components of an apparatus. However, if diodes to which a large current of as much as several amperes is applied are integrated, a parasitic-current may flow due to a parasitic transistor effect that inevitably occurs in the integrated circuit. A parasitic current flows as a reactive current, and moreover, it contains a danger of latch up in the worst case.

In view of the above, as a structure to prevent a parasitic current, a structure as described in, for example, Japanese Unexamined Patent Publication No. Hei-6-100459 has been proposed.

As shown in FIG. 15, an N$^+$-type buried layer 3 is provided between a P$^-$-type semiconductor substrate 1 and an N$^-$-type semiconductor substrate 2. In a manner surrounding this buried layer 3, a P$^+$-type isolation region 4 is diffused from the surface of the semiconductor layer 2 to the semiconductor substrate 1, thereby forming one island 5. Then, on the buried layer 3, a P$^+$-type buried layer 6 is formed in a partly overlapping manner. In a manner surrounding this P$^+$-type buried layer 6, an N$^+$-type derivative regions 7 from the semiconductor layer 2 surface to the N$^+$-type buried layer 3 is formed. In this surrounded region, an N$^+$-type diffusion region 8 is formed. Furthermore, in the region surrounded by the derivative region 7, formed is a P$^+$-type derivative region 9 which surrounds the diffusion region 8 and reaches the P$^+$-type buried layer 6 from the semiconductor layer 2. Furthermore, a cathode electrode 10 is provided in the diffusion region 8, and an anode electrode 11 is formed in the P$^+$-type derivative region 9, and this anode electrode is electrically connected to the N$^+$-type derivative region 7.

Namely, the P$^+$-type derivative regions 9 and the P$^+$-type buried layer 6 form an anode region, and an N—type semiconductor region surrounded by the N$^+$-type diffusion region 8 and derivative region 9 forms a cathode region, whereby a diode is constructed.

In such a diode element, created is a PNP-type parasitic transistor Tr2 which utilizes the N$^+$-type buried layer 3 as a base, the P$^+$-type buried layer 6 as an emitter, and the P-type semiconductor substrate 1 and the P$^+$-type isolation layer 4 as a collector. However, since potential becomes the same between the base and emitter of this parasitic transistor Tr2 by a connection of the anode electrode, an ON-operation of the parasitic PNP transistor Tr2 can be prevented.

As described above, in the prior-art semiconductor integrated circuit device, if the load is an inductive load, a forward/counter electromotive force occurs with a rotation/stop of the motor, as shown in FIG. 14. Therefore, a protection diode is connected between the collector and emitter of the series-connected transistors formed in an IC. And, the diodes 12 are turned on when the output terminals become lower than the GND potential or higher than the VCC potential due to the counter electromotive force, whereby the electromotive force is released to a fixed potential. Thus, the inside of the IC including the series-connected transistors has been protected. In particular, when a large current of as much as several amperes was applied to the diodes 12, discrete components have been used as the diodes 12.

Moreover, for a demand that the diodes 12 should also been formed in an IC for a reduction in the number of components of an apparatus, diodes to which a large current of as much as several amperes was applied have been integrated However, because of problems such that a parasitic current flowed due to a parasitic transistor effect that inevitably occurred in an integrated circuit and a reactive current flowed, a structure wherein the diodes were taken inside the IC was provided.

However, there is a case where although the diodes 12 could be taken inside the IC as mentioned above, the diodes 12 were off, that is, the cathode electrode 10 became higher in voltage than the anode electrode 11 as shown in FIG. 15. In this case, a withstand voltage to cope with a semiconductor element breakdown caused by a breakdown current at the PN-junction surface of a parasitic transistor TR1 is required. That is, the prior-art structure has a problem such that, since the width of the P$^+$-type buried layer 6 as a base region of the parasitic transistor TR1 is narrow, a current amplification factor hfe cannot be easily controlled and a withstand voltage of the parasitic transistor TR1 cannot be secured.

Furthermore, as shown in FIG. 15, in the prior-art structure, potential becomes the same between the base and emitter so that the parasitic transistor TR2 can suppress an ON-operation, however, a leakage current flows via the substrate. Therefore, there exists a problem such that due to a leakage current of the parasitic transistor TR2, a desirable forward current cannot be obtained.

SUMMARY OF THE INVENTION

The present invention has been made in view of the above-described prior-art problems, and a semiconductor integrated circuit device of the present invention comprises: a semiconductor substrate of one conductivity type; at least one epitaxial layer(s) of the opposite conductivity type deposited on the surface of the substrate; a first opposite-conductivity-type buried layer formed between the substrate and a first epitaxial layer; a first one-conductivity-type buried layer which is formed between the substrate and the first epitaxial layer and is also formed in a manner overlapping with the first opposite-conductivity-type buried layer; a one-conductivity-type buried region which is connected to the first one-conductivity-type buried layer and is also connected to a first one-conductivity-type diffusion region formed in an uppermost epitaxial layer; an opposite-conductivity-type buried region which is connected to the first opposite-conductivity-type buried layer is also connected to a first opposite-conductivity-type diffusion region formed in the uppermost epitaxial layer; and a second opposite-conductivity-type diffusion region which is formed in the uppermost epitaxial layer in a manner surrounded by the first one-conductivity-type diffusion region, and is characterized in that a second one-conductivity-type diffusion region formed in the uppermost epitaxial layer is at least partly overlapped with the first one-conductivity-type diffusion region, and an anode electrode connects the first opposite-conductivity-type diffusion region and the second one-conductivity-type diffusion region.

Preferably, the semiconductor integrated circuit device of the present invention is characterized in that, with the second opposite-conductivity-type diffusion region, an opposite-conductivity-type well region is formed from the surface of the uppermost epitaxial layer in an overlapping manner.

Moreover, preferably, the semiconductor integrated circuit device of the present invention is characterized in that at least the upper surface of the first one-conductivity-type buried layer is located closer to the side of the second opposite-conductivity-type diffusion region than the upper surface of the first opposite-conductivity-type buried layer, and the first one-conductivity-type buried layer and the second opposite-conductivity-type diffusion region are formed with an interval in the depth direction.

First, in a diode element of a semiconductor integrated circuit device of the present invention, P-type first and second diffusion regions are formed so that both are partly overlapped with each other, and are characterized in that both are connected to an anode electrode at a part immediately over the second diffusion region. Thereby, parasitic resistance including the P-type second diffusion region can be increased. And, base potential of a parasitic PNP transistor can be securely made higher than the emitter potential. As a result, an operation of the PNP transistor when the diode element is on can be securely suppressed and a leakage current to a substrate can be greatly suppressed.

Second, a diode element of a semiconductor integrated circuit device of the present invention is characterized in that, similar to the first effect, parasitic resistance including the P-type second diffusion region can be increased. Thereby, collector potential of a parasitic NPN transistor can be securely made higher than the base potential. As a result, forward current of the diode element can be greatly increased by an operation of the parasitic NPN transistor.

Third, in a diode element of a semiconductor integrated circuit device of the present invention, by forming polysilicon with an impurity doped on the surface of the second epitaxial layer in place of the P-type second diffusion region, similar effects can be obtained. In other words, similar to the case of a P-type second diffusion region, by increasing parasitic resistance by polysilicon, the aforementioned first and second effects can be obtained.

Fourth, a diode element of a semiconductor integrated circuit device of the present invention is characterized in that, depending on usage application, etc., an N-type well region is formed in a second epitaxial layer so as to surround a cathode lead-out region. Thereby, owing to the N-type well region, the resistance value of an N-type region of a PN junction is lowered, whereby forward voltage (VBEF) is reduced. As a result, forward current characteristics (If) of the diode element can be greatly improved. And, the N-type well region can be formed at an arbitrary option based on a comparative consideration of the withstand voltage characteristics and forward current characteristics (If).

DESCRIPTION OF THE PREFERRED EMBODIMENTS

Hereinafter, a semiconductor integrated circuit device of the present invention will be described in detail with reference to FIG. 1 through FIG. 5. In FIG. 1, a first embodiment is illustrated, and in FIG. 4, a second embodiment is illustrated.

First Embodiment

Figure 1A:
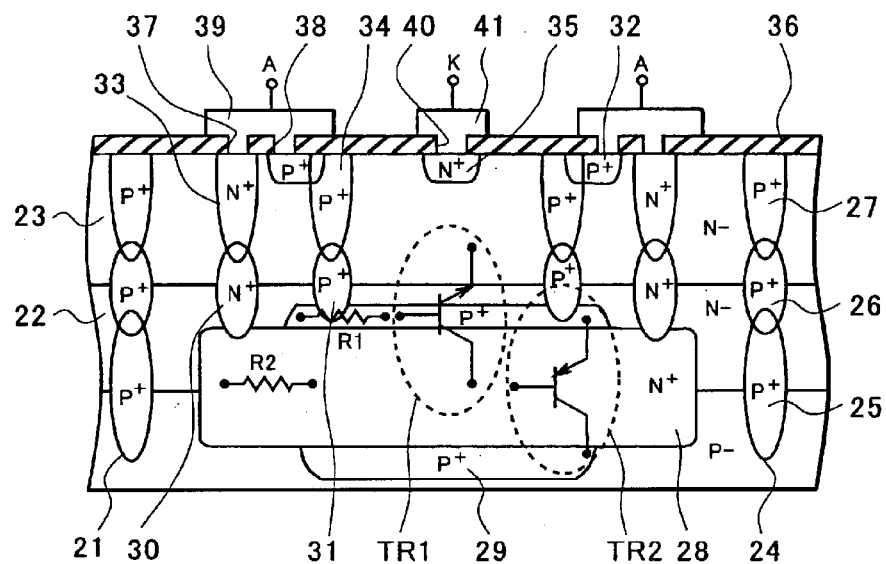
FIG. 1A is a sectional view and FIG. 1B is an equivalent circuit diagram for explaining a diode element of a semiconductor integrated circuit device of the present invention.
Figure 1B:
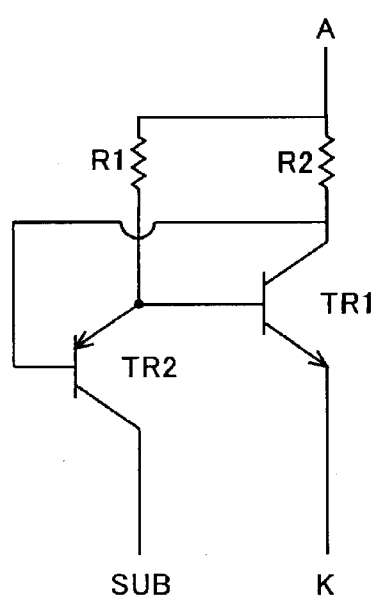

FIG. 1A is a sectional view showing a structure of a semiconductor integrated circuit device of the present invention, and FIG. 1B is a circuit diagram of a semiconductor integrated circuit device of the present invention. In the present embodiment, only a region where a diode element of a semiconductor integrated circuit device is formed is illustrated and described, however, in other regions, a vertical PNP transistor element, an NPN transistor element, etc., are formed.

As shown in FIG. 1A, on a P⁻-type single crystal silicon substrate 21, a first epitaxial layer 22 having a thickness of 2–10 μm is formed, and on the first epitaxial layer 22, a second epitaxial layer 23 having a thickness of 8–10 μm is formed. The first and second epitaxial layers 22 and 23 are formed so that a total film thickness of the respective two layers becomes approximately 8–16 μm. In addition, in the substrate 21 and the first and second epitaxial layers 22 and 23, an island region to form a diode element is formed by P⁺-type isolation regions 24, which penetrate therethrough. As mentioned above, in the present embodiment, although only the diode element is illustrated, in addition thereto, island regions to form a vertical PNP transistor element and an NPN transistor element, etc., are formed by P⁺-type isolation regions 24.

These isolation regions 24 are each composed of a first isolation region 25 which is diffused in the up-and-down direction from the surface of the substrate 21, a second isolation region 26 which is diffused in the up-and-down direction from the boundary between the first and second epitaxial layers 22 and 23, and a third isolation region 27 which is formed from the surface of the second epitaxial layer 23. And, a connection of the three layers isolates the first and second epitaxial layers 22 and 23 into island shapes.

Hereinafter, a diode element of the present invention will be described. As illustrated, an N⁺-type first buried layer 28 and a P⁺-type first buried layer 29 are formed in an overlapping manner between the substrate 21 and first epitaxial layer 22. A P⁺-type second buried layer 31 and an N⁺-type second buried layer 30 are formed at a boundary part between the first and second epitaxial layers 22 and 23. The N⁺-type second buried layer 30 and the P⁺-type second buried layer 31 are partly overlapped with the N⁺-type first buried layer 28 and the P⁺-type first buried layer 29, respectively. In addition, a P⁺-type first diffusion region 34 from the surface of the second epitaxial layer 23 to the P⁺-type second buried layer 31 is formed. And, the N⁻-type first and second epitaxial layers 22 and 23 sandwiched by these P⁺-type regions 31 and 34 are formed as a cathode region, whereby a PN-junction diode is constructed. At this time, an N⁺-type first diffusion region 33 from the surface of the second epitaxial layer 23 to the N⁺-type second buried layer 30 is formed.

Moreover, in the present invention, a P⁺-type second diffusion region 32 is formed from the surface of the second epitaxial layer 23, and a part of the P⁺-type second diffusion region 32 is overlapped with the P⁺-type first diffusion region 34. A contact hole 38 for a connection to an anode electrode 39 is formed in an insulation layer 36 formed on the surface of the second epitaxial layer 23. At this time, the contact hole 38 is formed immediately over the P⁺-type second diffusion region 32 for a connection between the P⁺-type second diffusion region 32 and anode electrode 39. And, an N⁺-type first diffusion region 33 and the P⁺-type second diffusion region 32 are short-circuited via the anode electrode 39. Consequently, the base and collector of a parasitic NPN transistor TR1 and the base and emitter of a parasitic PNP transistor are short-circuited (details will be described later). Moreover, the P⁺-type second diffusion region 32 is formed for the purpose of making the emitter-side resistance value of the parasitic PNP transistor TR2 higher than the resistance value of the base side (details will be described later). Therefore, the position of the contact hole 38 can be arbitrarily changed according to a desirable resistance value.

In the present embodiment, the N⁺-type first buried layer 28 and the P⁺-type first buried layer 29 are formed in an overlapping manner between the substrate 21 and first epitaxial layer 22. And, for example, the N⁺-type first buried layer 28 is formed of antimony (Sb), and the P⁺-type first buried layer 29 is formed of boron (B). Accordingly, due to differences in the impurity diffusing speed and the impurity using concentration, a structure wherein the P⁺-type first buried layers 29 is formed over and under the N⁺-type first buried layer 28 is provided as shown in FIG. 1. Then, as mentioned above, a PN-junction diode wherein the P⁺-type first and second buried layers 29 and 31 and the P⁺-type first and second diffusion regions 34 and 32 are formed as an anode region, and the first and second epitaxial layers 22 and 23 are formed as a cathode region is formed. In addition, in the second epitaxial layer 23 formed as the cathode region, an N⁺-type second diffusion region 35 is formed as a cathode lead-out region. Then, in the structure, the N⁺-type diffusion region 35 and P⁺-type first buried layer 29 are formed with an interval in the depth direction.

According to the aforementioned structure of the present invention, there is a case where the diode element is off, that is, a reverse bias has been applied to a PN-junction surface formed by the P⁺-type first buried layer 29 and the N⁻-type first epitaxial layer 22. In this case, a great depletion layer-forming region can be obtained in the N-type region composed of the first and second epitaxial layers 22 and 23. Then, by securing a withstand voltage by the depletion layer formed in the N-type region, an internal element breakdown caused by a breakdown current can be suppressed.

The surface of the second epitaxial layer 23 is coated by the insulation layer 36, and various aluminum electrodes are provided via contact holes 37, 38, and 40 formed in the insulation layer 36. Moreover, although unillustrated, the substrate 21 is grounded for junction isolation.

As shown in FIG. 1A and FIG. 1B, in the structure of the present embodiment, based on an ON of the diode element, a parasitic NPN transistor TR1, a parasitic PNP transistor TR2, and parasitic resistance R1 and R2 are mainly formed. Hereinafter, a description will be given of operations of the parasitic transistors that influence a leakage current to the substrate 21 when the diode element is on.

First, a parasitic NPN transistor TR1 is composed of the N⁺-type buried layer 28 as a collector, the P⁺-type first buried layer 29 as a base, and the first and second epitaxial layers 22 and 23 as an emitter. And, in the base of the parasitic NPN transistor TR1, formed is a parasitic resistance R1 composed of the P⁺-type first and second buried layers 29 and 31 and the P⁺-type first and second diffusion regions 34 and 32. On the other hand, in the collector of the parasitic transistor TR1, formed is a parasitic resistance R2 composed of the N⁺-type first and second buried layers 28 and 30 and the N⁻-type first diffusion region 33. As illustrated, the present invention is characterized in that the P⁺-type first and second diffusion regions 34 and 32 are formed in the second epitaxial layer 23. Moreover, both are formed in a partly overlapping manner and are connected, on the P⁺-type second diffusion region 32, to the anode electrode 39.

Thereby, the parasitic resistance R1 can be increased in its resistance value by this region of the P⁺-type second diffusion region 32. Design of the resistance value of the parasitic resistance R1 can be arbitrarily changed according to the usage application, etc., and the resistance value can be adjusted by the P+-type second diffusion region 32 forming region or by the contact hole 38 forming position. In the present embodiment, the resistance value of the parasitic resistance R1 is to increase by 1–3 by formation of the P+-type second diffusion region 32. That is, the resistance value of the parasitic resistance R1 is to become greater than the resistance value of the parasitic resistance R2. As a result, in the parasitic NPN transistor TR1, the base and collector are short-circuited by a connection to the identical anode 39, while potential of the collector can be maintained higher than the base potential. And, in the parasitic NPN transistor TR1, since an electric current flows in the direction identical to that of a forward current (If) of the diode element, forward current (If) characteristics of the diode element can be improved.

On the other hand, a parasitic PNP transistor TR2 is composed of the P−-type substrate 21 as a collector, the N+-type first buried layer 28 as a base, and the P+-type first buried layer 29 as an emitter. And, in the emitter of the parasitic NPN transistor TR2, formed is a parasitic resistance R1 composed of the P+-type first and second buried layers 29 and 31 and the P+-type first and second diffusion regions 34 and 32. On the other hand, in the base of the parasitic transistor TR2, formed is a parasitic resistance R2 composed of the N+-type first and second buried layers 28 and 30 and the N−-type first diffusion region 33. And, as mentioned above, the present invention is characterized in that the P+-type second diffusion region 32 is formed, and the resistance value of the parasitic resistance R1 is to become greater than the resistance value of the parasitic resistance R2.

Thereby, in the parasitic PNP transistor TR2, the base and emitter are short-circuited by a connection to the identical anode 39, while base potential can be maintained higher than the emitter potential. As a result, in the parasitic PNP transistor TR2, the base potential can be securely maintained higher than the emitter potential by the P+-type second diffusion region 32. And, an ON-operation of the parasitic PNP transistor TR2 can be prevented, whereby a leakage current to the substrate 21 can be suppressed via the parasitic transistor TR2 as much as possible.

Figure 2:
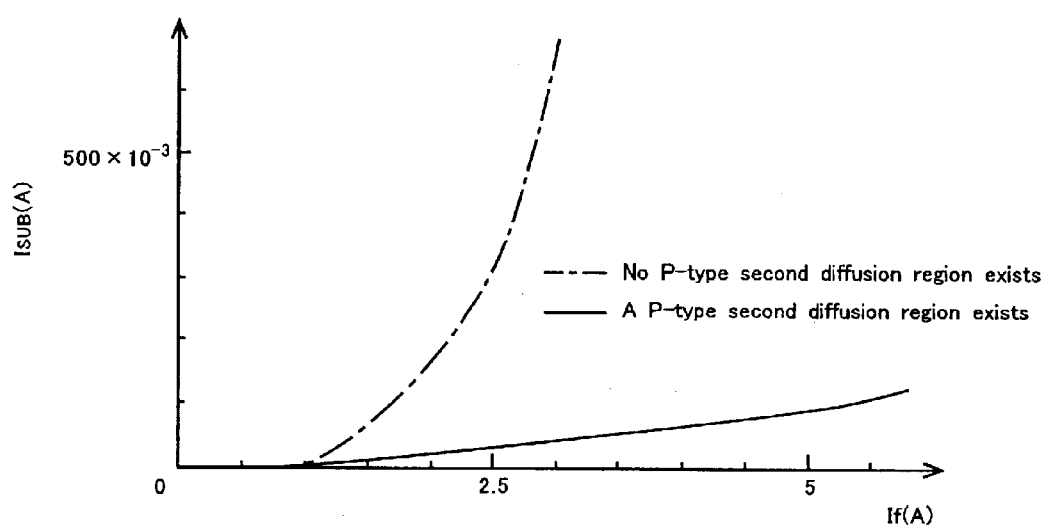
FIG. 2 is a characteristic diagram showing a relationship between forward current and leakage current to a substrate of a semiconductor integrated circuit device of the present invention.

FIG. 2 is a diagram showing a relationship between a forward current (If) of the diode element and a leakage current (Isub) to the substrate 21 in a case where the P+-type second diffusion region 32 is formed and in a case where the same is not formed. Concretely, the alternate long and short dash line shows a case where the P+-type second diffusion region 32 is not formed and the P+-type first diffusion region 34 and the N+-type first diffusion region 33 are connected by the identical abode electrode 39. On the other hand, the solid line shows a case where the P+-type second diffusion region 32 is formed and the P+-type second diffusion region 32 and N+-type first diffusion region 33 are connected by the identical anode electrode 39. As illustrated, for obtaining, for example, 2.5(A) of a forward current (If) of the diode element, a leakage current (Isub) to the substrate 21 occurs on the order of 300×10$^{-3}$ (A) if the P+-type second diffusion region 32 is not formed. On the other hand, a leakage current (Isub) to the substrate 21 occurs on the order of 50×10$^{-3}$ (A) if the P+-type second diffusion region 32 is formed. Moreover, it has been proved through experimentation that the more the forward current (If) of the diode element is increased, the greater the difference in the leakage currents (Isub) to the substrate 21 becomes. In other words, by forming the P+-type second diffusion region 32 and making the resistance value of the parasitic resistance R1 greater than the resistance value of the parasitic resistance R2, leakage current (Isub) to the substrate 21 is decreased, whereby forward current (If) of the diode element can be increased.

Figure 3:
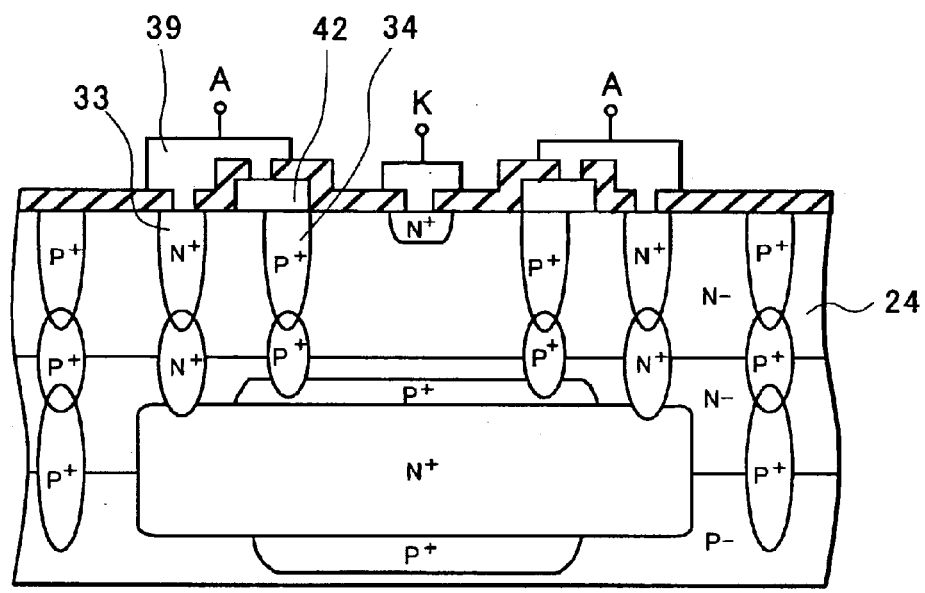
FIG. 3 is a sectional view for explaining a semiconductor integrated circuit device according to the present invention.

Herein, a structure shown by FIG. 3 will be described. FIG. 3 is a sectional view in a case where the P+-type second diffusion region 32 of the present invention is not formed but polysilicon 42 is formed on the surface of the second epitaxial layer 22 in which the P+-type first diffusion region 34 is formed. As illustrated, by forming the polysilicon 42 on the surface of the second epitaxial layer 22 and utilizing the polysilicon 42 as a resistance, effects similar to those of the aforementioned structure of FIG. 1A can be obtained. In this case, the polysilicon 42 can be freely changed in its resistance value by the amount of an impurity doped in the polysilicon 42, and can be treated similarly to the P+-type second diffusion region 32. Since other structural aspects and effects are similar to those of the aforementioned structure of FIG. 1A, description thereof will be omitted here by reference to the aforementioned description.

Figure 5A:
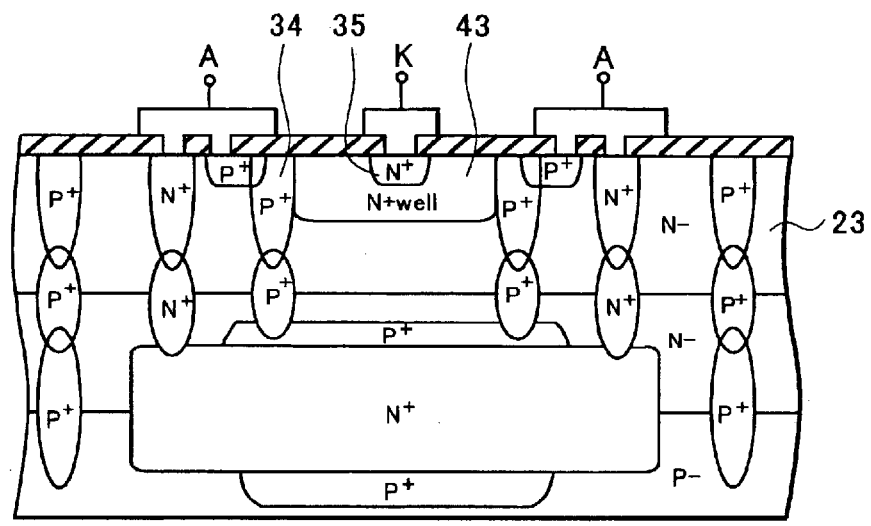
FIG. 5A is a sectional view and FIG. 5B is a sectional view for explaining a semiconductor integrated circuit device of the present invention.

In addition, as shown in FIG. 5A, a structure may be employed, wherein an N+-type well region 43 is formed so as to surround the N+-type second diffusion region 35 of the diode element as shown in FIG. 1A in an overlapping manner. And, owing to this structure, the N+-type well region 43 reduces a parasitic resistance in the second epitaxial layer 23 when the diode element is on. In other words, in the PN junction of the diode element of the present invention, resistance value of the N−-type region composed of the first and second epitaxial layers 22 and 23 can be lowered. Thereby, forward voltage (VBEF) of the diode element is reduced, whereby forward current (If) of the diode element can be improved. However, due to formation of the N+-type well region 43, the depletion layer-forming region that spreads from the PN-junction surface is reduced and a withstand voltage of the diode element in an OFF state is lowered. Therefore, depending on the usage application to which of the withstand voltage characteristics and the forward current (If) characteristics importance is attached, whether or not the N+-type well region 43 is formed is determined.

In addition to the above, various modifications can be carried out without departing from the scope of the present invention.

Second Embodiment

Figure 4A:
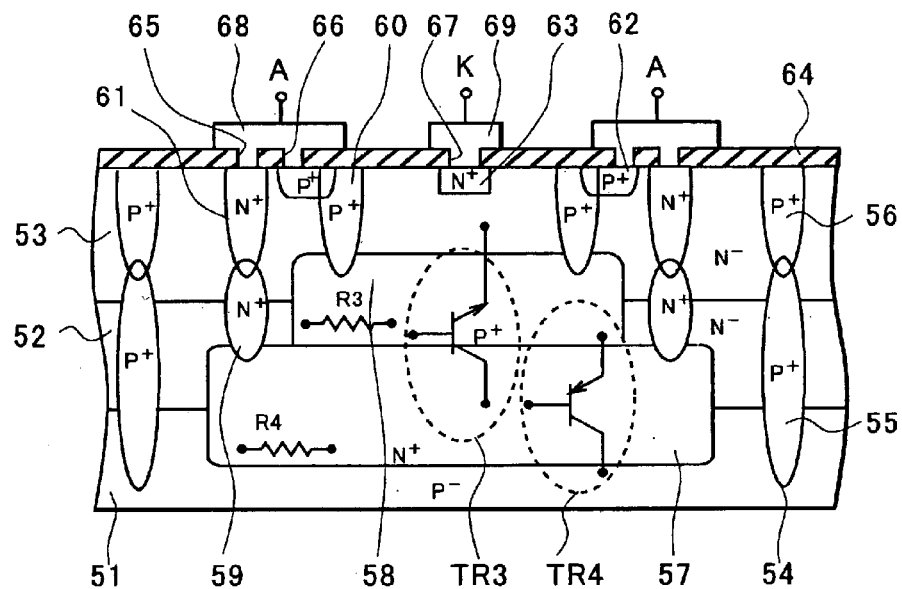
FIG. 4A is a sectional view and FIG. 4B is an equivalent circuit diagram for explaining a semiconductor integrated circuit device of the present invention.
Figure 4B:
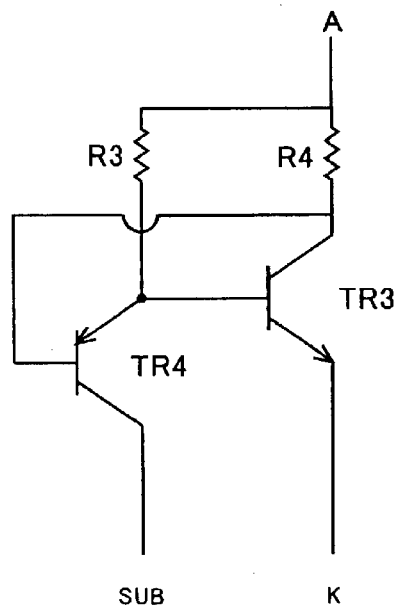

FIG. 4A is a sectional view showing a structure of a semiconductor integrated circuit device of the present invention, and FIG. 4B is a circuit diagram of a semiconductor integrated circuit device of the present invention. In the present embodiment, similar to the first embodiment, only a region where a diode element of a semiconductor integrated circuit device is formed is illustrated and described, however, in other regions, a vertical PNP transistor element, an NPN transistor element, etc., are formed.

As shown in FIG. 4A, on a P−-type single crystal silicon substrate 51, a first epitaxial layer 52 having a thickness of 2–10 μm is formed, and on the first epitaxial layer 52, a second epitaxial layer 53 having a thickness of 8–10 μm is formed. The first and second epitaxial layers 52 and 53 are formed so that a total film thickness of the respective two layers becomes approximately 8–16 μm. In addition, in the substrate 51 and the first and second epitaxial layers 52 and 53, an island region to form a diode element is formed by P+-type isolation regions 54, which penetrate therethrough. As mentioned above, in the present embodiment, although only the diode element is illustrated, in addition thereto, island regions to form a vertical PNP transistor element and an NPN transistor element, etc., are formed by P+-type isolation regions 54.

These isolation regions 54 are each composed of a first isolation region 55 which is diffused in the up-and-down direction from the boundary between the first and second epitaxial layers 52 and 53 and reaches to the substrate 51 in the lower direction and a second isolation region 56 formed from the surface of second epitaxial layer 53. And, a connection of both layers isolates the first and second epitaxial layers 52 and 53 into island shapes. Owing to this structure, the quantity of masks of the second embodiment can be reduced by one compared to that of the first embodiment.

Hereinafter, a diode element of the present invention will be described. As illustrated, an N+-type first buried layer 57 is formed between the substrate 51 and first epitaxial layer 52. With the N+-type first buried layer 57, a P+-type buried layer 58 from a boundary part between the first and second epitaxial layers 52 and 53 is formed in a partly overlapping manner. And, an N+-type second buried layer 59 is formed at a boundary part between the first and second epitaxial layers 52 and 53. This N+-type second buried layer 59 is partly overlapped with the N+-type first buried layer 57. In addition, a P+-type first diffusion region 60 from the surface of the second epitaxial layer 53 to the P+-type buried layer 58 is formed. And, the N−-type second epitaxial layer 53 sandwiched by these P+-type regions 58 and 60 are formed as a cathode region, whereby a PN-junction diode is constructed. At this time, an N+-type first diffusion region 61 from the surface of the second epitaxial layer 53 to the N+-type second buried layer 59 is formed.

Moreover, in the present invention, a P+-type second diffusion region 62 is formed from the surface of the second epitaxial layer 53, and a part of the P+-type second diffusion region 62 is overlapped with the P+-type first diffusion region 60. A contact hole 66 for a connection to an anode electrode 68 is formed in an insulation layer 64 formed on the surface of the second epitaxial layer 53. At this time, the contact hole 66 is formed immediately over the P+-type second diffusion region 62 for a connection between the P+-type second diffusion region 62 and anode electrode 68. And, an N+-type first diffusion region 61 and the P+-type second diffusion region 62 are short-circuited via the anode electrode 68. Consequently, the base and collector of a parasitic NPN transistor TR1 and the base and emitter of a parasitic PNP transistor are short-circuited (details will be described later). Moreover, the P+-type second diffusion region 62 is formed for the purpose of making the emitter-side resistance value of the parasitic PNP transistor TR2 higher than the resistance value of the base side (details will be described later). Therefore, the position of the contact hole 66 can be arbitrarily changed according to a desirable resistance value.

Then, as mentioned above, a PN-junction diode wherein the P+-type buried layer 58 and the P+-type first and second buried layers 60 and 62 are formed as an anode region and the second epitaxial layer 53 is formed as a cathode region is formed. In addition, in the second epitaxial layer 53 formed as the cathode region, an N+-type second diffusion region 63 is formed as a cathode lead-out region. Then, in the structure, the N+-type diffusion region 63 and P+-type first buried layer 58 are formed with an interval in the depth direction.

According to the aforementioned structure of the present invention, there is a case where the diode element is off, that is, a reverse bias has been applied to a PN-junction surface formed by the P+-type first buried layer 58 and the N−-type first epitaxial layer 53. In this case, a depletion layer-forming region can be obtained in the N-type region composed of the second epitaxial layer 53 and the P-type region composed of the P+-type buried layer 58. Then, by securing a withstand voltage by the depletion layer formed in the N-type region and the P-type region, an internal element breakdown caused by a breakdown current can be suppressed.

In addition, the surface of the second epitaxial layer 53 is coated by the insulation layer 64, and various Al electrodes are provided via contact holes 65, 66, and 67 formed in the insulation layer 64. Moreover, although unillustrated, the substrate 51 is grounded for junction isolation.

In the present embodiment, a parasitic NPN transistor TR3 is composed of the first epitaxial layer 53 as an emitter, the P+-type buried layer 58 as a base, and the N+-type first buried layer 57 as a collector. A parasitic PNP transistor TR4 is composed of the P+-type buried layer 58 as an emitter, the N+-type first buried layer 57 as a base, and the P−-type substrate 51 as a collector. A parasitic resistance R3 is composed of the P+-type first and second diffusion regions 60 and 62 and the P+-type buried layer 58. And, a parasitic resistance R4 is composed of the N−-type first and second buried layers 57 and 59 and the N−-type first diffusion region 61. The aforementioned four have a relationship as shown in the circuit diagram of FIG. 4B, which is the same as that of the circuit in the first embodiment as shown in FIG. 1B. Moreover, similar to the first embodiment, the second embodiment is also characterized in that the P+-type second diffusion region 62 is formed and the resistance value of the parasitic resistance R3 is made greater than the resistance value of the parasitic resistance R4. Accordingly, the effects described in the first embodiment can be similarly obtained in the second embodiment, as well, therefore, description thereof will be omitted here by reference to the description in the first embodiment.

Figure 5B:
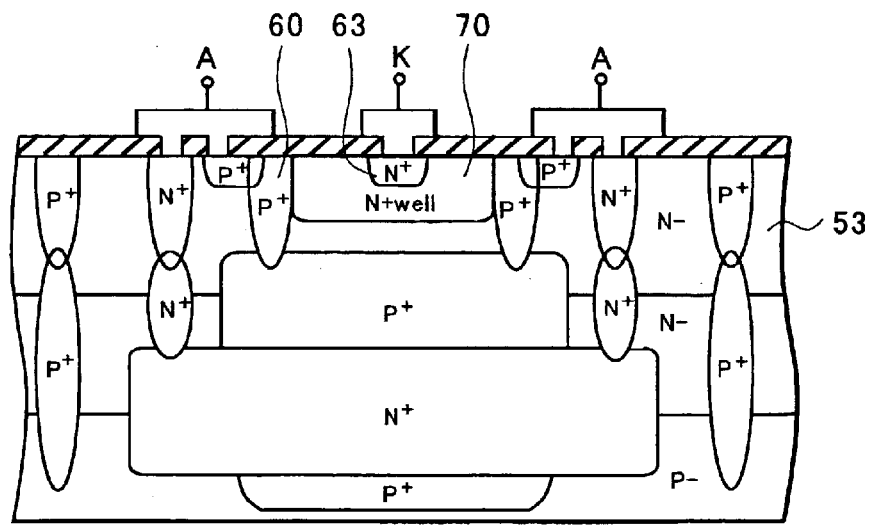

In the present embodiment, as well, as shown in FIG. 3 according to the first embodiment, the P+-type second diffusion region 62 may be changed to a resistance composed of polysilicon 42. Then, as shown in FIG. 5B, in the present embodiment, as well, depending on the usage application to which of the withstand voltage characteristics and the forward current (If) characteristics importance is attached, whether or not an N+-type well region 70 is formed is determined.

In addition to the above, various modifications can be carried out without departing from the scope of the present invention.

Next, a method for manufacturing a semiconductor integrated circuit device of the present invention as shown in FIG. 1 will be described with reference to FIG. 6 through FIG. 13.

Figure 6:
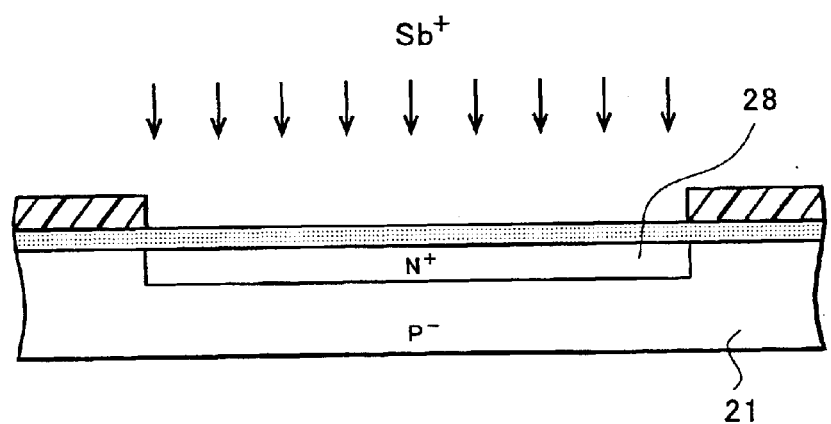
FIG. 6 is a sectional view for explaining a method for manufacturing a semiconductor integrated circuit device of the present invention.

First, as shown in FIG. 6, a P−-type single crystal silicon substrate 21 is prepared, and the surface of this substrate 21 is thermally oxidized to form, on the entire surface, a silicon oxide film on the order of 0.03–0.05 μm, for example. Thereafter, a photoresist having an opening portion at a part where an N+-type first buried layer 28 is to be formed is formed as a selective mask by a widely known photolithography technique. Thereafter, an N-type impurity, for example, antimony (Sb) is ion-implanted and diffused with an accelerating voltage 20–65 keV and a doping amount $1.0 \times 10^{13} – 1.0 \times 10^{15}/cm^2$.

Figure 7:
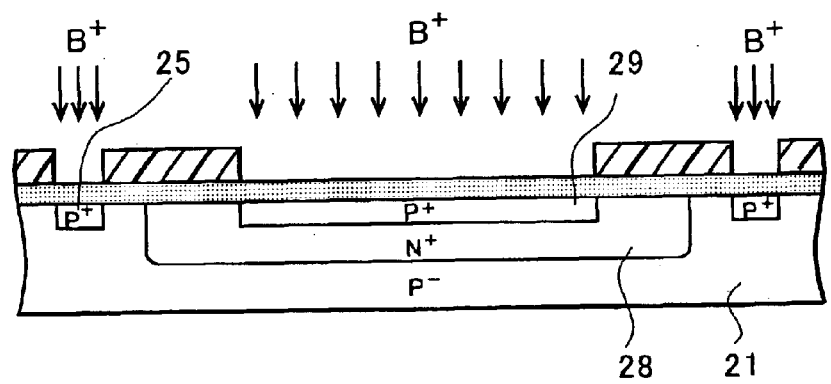
FIG. 7 is a sectional view for explaining a method for manufacturing a semiconductor integrated circuit device of the present invention.

Next, as shown in FIG. 7, on the silicon oxide film formed in FIG. 6, a photoresist having opening portions at parts where a first isolation region 25 of an isolation region 24 and a P$^+$-type first buried layer 29 are to be formed is formed as a selective mask by a widely-known photolithography technique. Then, a P$^-$-type, for example, boron (B) is ion-implanted and diffused with an accelerating voltage 60–100 keV and a doping amount $1.0\times10^{13}$–$1.0\times10^{15}$/cm$^2$. Thereafter, the photoresist is removed. At this time, an N$^+$-type first buried layer 28 is simultaneously diffused.

Figure 8:
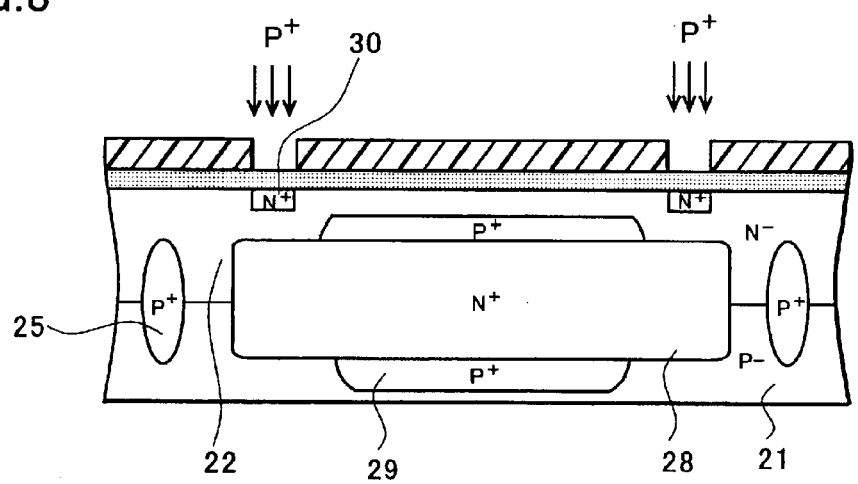
FIG. 8 is a sectional view for explaining a method for manufacturing a semiconductor integrated circuit device of the present invention.

Next, as shown in FIG. 8, the silicon oxide film formed in FIG. 6 is completely removed, and the substrate 21 is arranged on a susceptor of an epitaxial growth system. A high temperature on the order of, for example, 1000° C. is applied to the substrate 21 by lamp heating and an SiH$_2$Cl$_2$ gas and an H$_2$ gas are doped in the reaction tube. Thereby, on the substrate 21, a first epitaxial layer 22 having, for example, a specific resistance 1.25·cm and a thickness 2.0–10.0 μm is grown. Thereafter, the surface of the first epitaxial layer 22 is thermally oxidized to form a silicon oxide film on the order of, for example, 0.03–0.05 μm. Then, a photoresist having an opening portion at a part where an N$^+$-type second buried layer 30 is to be formed is formed as a selective mask by a widely-known photolithography technique. Then, an N-type impurity, for example, phosphorous (P) is ion-implanted and diffused with an accelerating voltage 20–65 keV and a doping amount $1.0\times10^{13}$–$1.0\times10^{15}$/cm$^2$. Thereafter, the photoresist is removed. At this time, an N$^+$-type first buried layer 28, a P$^+$-type first isolation region 25, and a P$^+$-type first buried layer 29 are simultaneously diffused.

Figure 9:
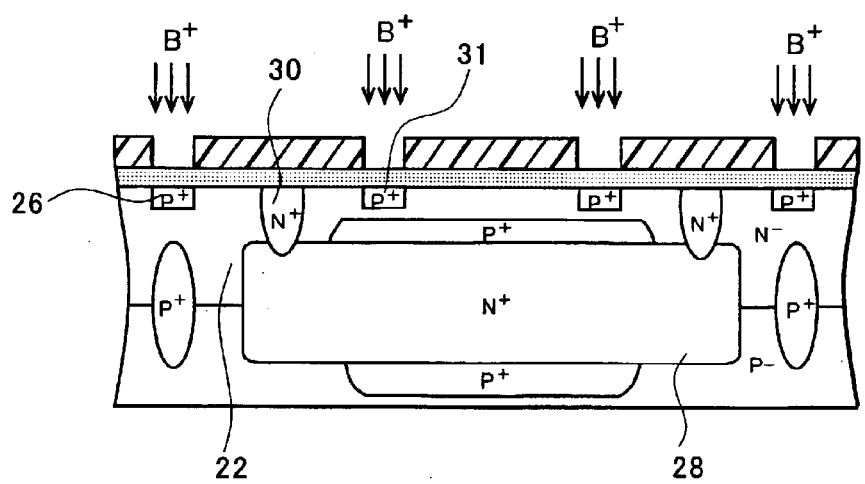
FIG. 9 is a sectional view for explaining a method for manufacturing a semiconductor integrated circuit device of the present invention.

Next, as shown in FIG. 9, on the silicon oxide film formed in FIG. 8, a photoresist having opening portions at parts where a second isolation region 26 of an isolation region 24 and a P$^+$-type second buried layer 31 are to be formed is formed as a selective mask by a widely-known photolithography technique. Then, a P$^-$-type, for example, boron (B) is ion-implanted and diffused with an accelerating voltage 60–100 keV and a doping amount $1.0\times10^{13}$–$1.0\times10^{15}$/cm$^2$. Thereafter, the photoresist is removed. At this time, an N$^+$-type second buried layer 30 is simultaneously diffused.

Figure 10:
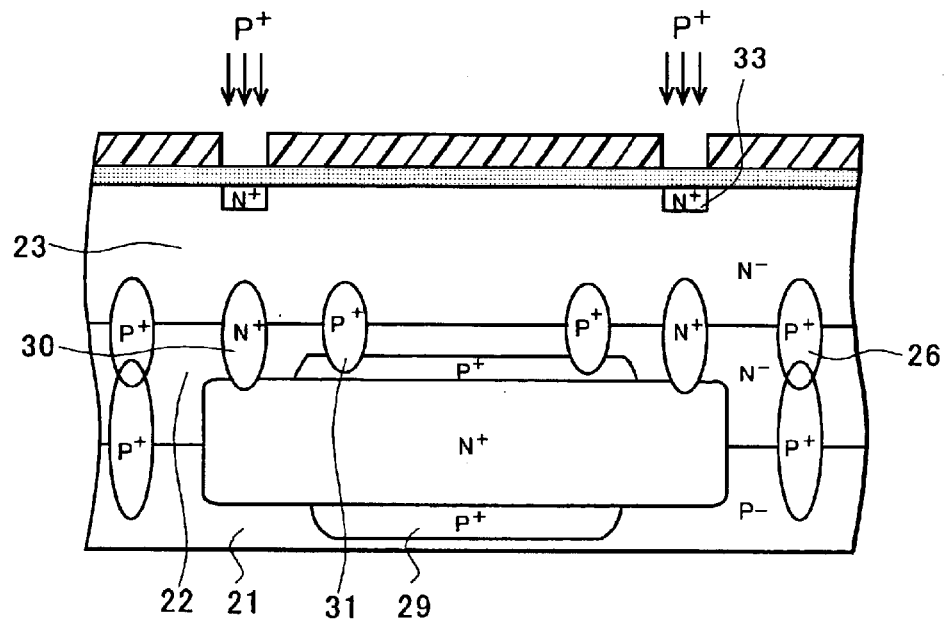
FIG. 10 is a sectional view for explaining a method for manufacturing a semiconductor integrated circuit device of the present invention.

Next, as shown in FIG. 10, the silicon oxide film formed in FIG. 8 is completely removed, and the substrate 21 is arranged on a susceptor of an epitaxial growth system. A high temperature on the order of, for example, 1000° C. is applied to the substrate 21 by lamp heating and an SiH$_2$Cl$_2$ gas and an H$_2$ gas are introduced in a reaction tube. Thereby, on the substrate 21, a second epitaxial layer 23 having a specific resistance 1.25 cm and a thickness 8.0–10.0 μm is grown. Thereafter, the surface of the second epitaxial layer 22 is thermally oxidized to form a silicon oxide film on the order of, for example, 0.03–0.05 μm. Then, a photoresist having an opening portion at a part where an N$^+$-type first buried layer 33 is to be formed is formed as a selective mask by a widely-known photolithography technique. Then, an N-type impurity, for example, phosphorous (P) is ion-implanted and diffused with an accelerating voltage 20–65 keV and a doping amount $1.0\times10^{13}$–$1.0\times10^{15}$/cm$^2$. Thereafter, the photoresist is removed. At this time, an N$^+$-type second buried layer 30, a P$^+$-type second isolation region 26, and a P$^+$-type second buried layer 31 are simultaneously diffused.

Figure 11:
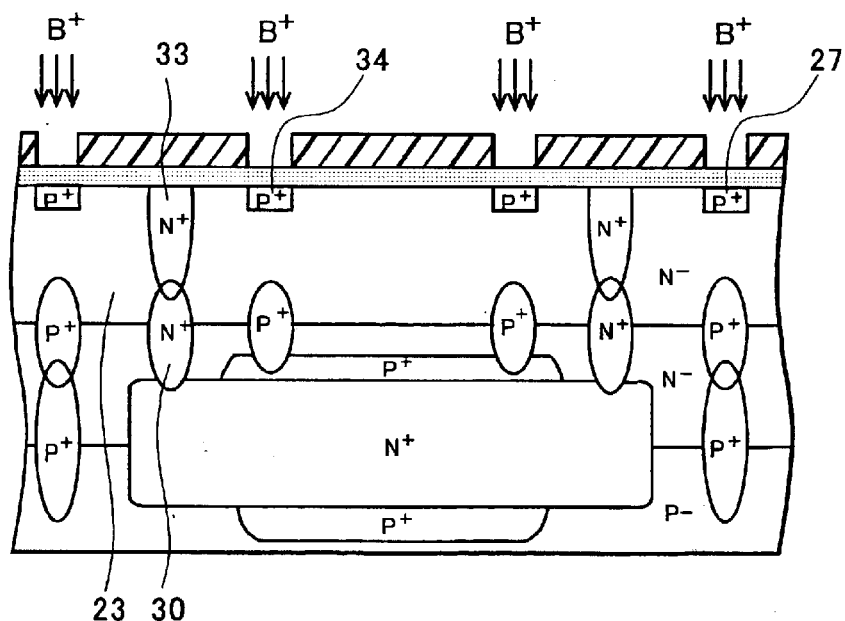
FIG. 11 is a sectional view for explaining a method for manufacturing a semiconductor integrated circuit device of the present invention.

Next, as shown in FIG. 11, on the silicon oxide film formed in FIG. 10, a photoresist having opening portions at parts where a third isolation region 27 of an isolation region 24 and a P$^+$-type first buried layer 34 are to be formed is formed as a selective mask by a widely-known photolithography technique. Then, a P$^-$-type, for example, boron (B) is ion-implanted and diffused with an accelerating voltage 60–100 keV and a doping amount $1.0\times10^{13}$–$1.0\times10^{15}$/cm$^2$. Thereafter, the photoresist is removed. At this time, an N$^+$-type first diffusion region 33 is simultaneously diffused.

Figure 12:
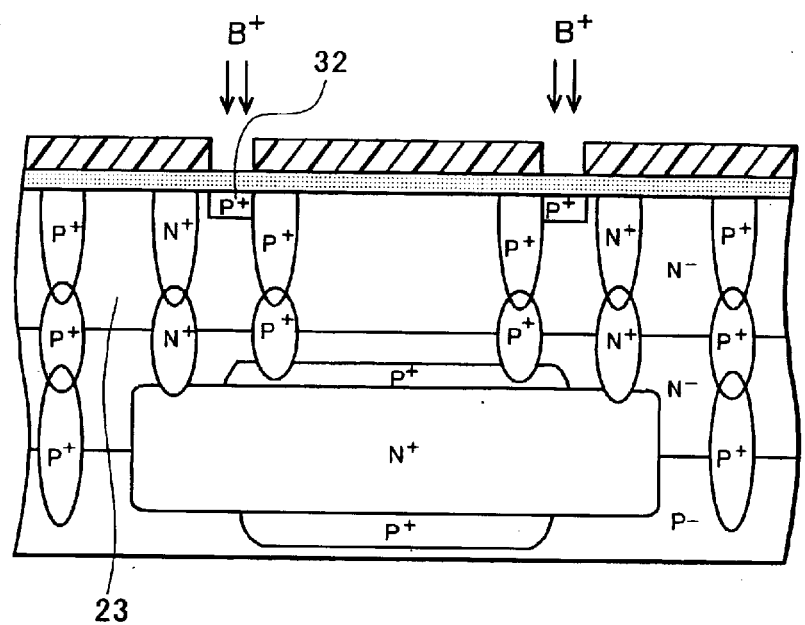
FIG. 12 is a sectional view for explaining a method for manufacturing a semiconductor integrated circuit device of the present invention.

Next, as shown in FIG. 12, on the silicon oxide film formed in FIG. 10, a photoresist having an opening portion at a part where a P$^+$-type second buried layer 32 is to be formed is formed as a selective mask by a widely-known photolithography technique. Then, a P$^-$-type, for example, boron (B) is ion-implanted and diffused with an accelerating voltage 60–100 keV and a doping amount $1.0\times10^{13}$–$1.0\times10^{15}$/cm$^2$. Thereafter, the photoresist is removed. At this time, a third isolation region 27 and a P$^+$-type first buried layer 34 are simultaneously diffused.

Figure 13:
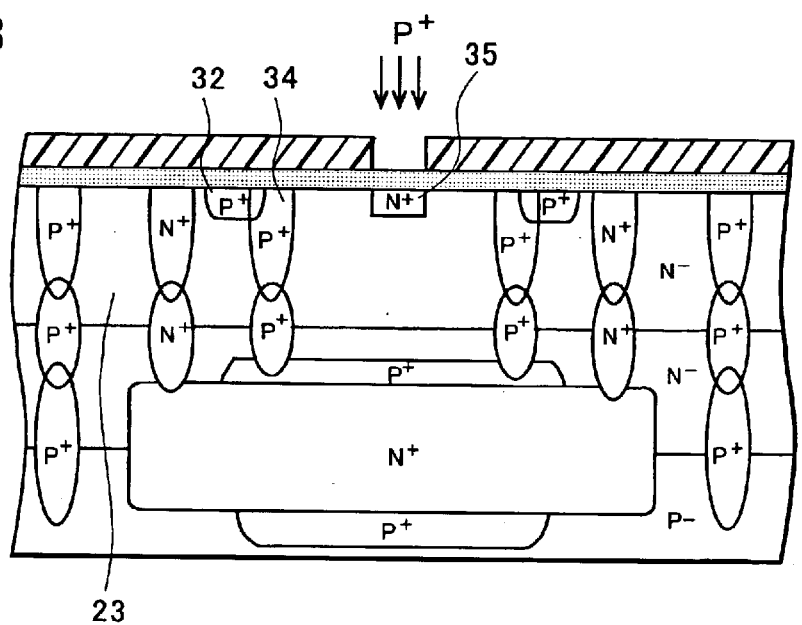
FIG. 13 is a sectional view for explaining a method for manufacturing a semiconductor integrated circuit device of the present invention.
Figure 14:
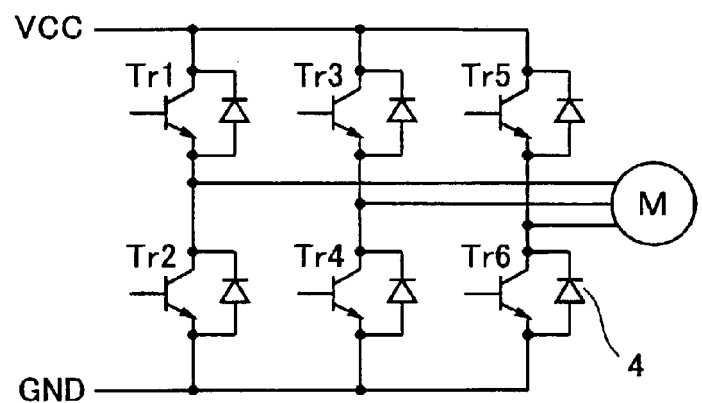
FIG. 14 is an equivalent circuit diagram for explaining a prior-art semiconductor integrated circuit device.
Figure 15:
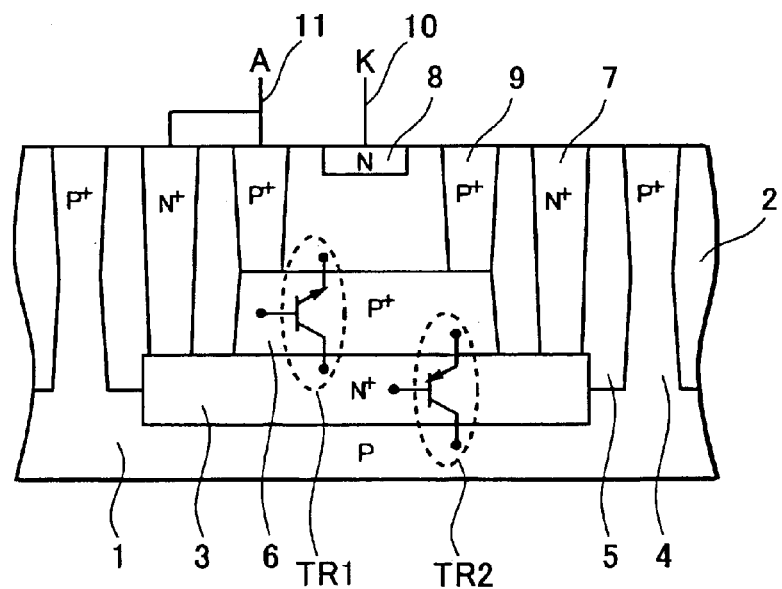
FIG. 15 is a sectional view for explaining a diode element of a prior-art semiconductor integrated circuit device.

Next, as shown in FIG. 13, on the silicon oxide film formed in FIG. 10, a photoresist having an opening portion at a part where an N$^+$-type second buried layer 35 is to be formed is formed as a selective mask by a widely-known photolithography technique. Then, an N$^-$-type impurity, for example, phosphorous (P) is ion-implanted and diffused with an accelerating voltage 20–65 keV and a doping amount $1.0\times10^{13}$–$1.0\times10^{15}$/cm$^2$. Thereafter, the photoresist is removed. At this time, a P$^+$-type second buried layer 32 is simultaneously diffused.

Lastly, an anode electrode 39 and a cathode electrode 41 made of, for example, Al are formed via contact holes 37, 38, and 40 formed in an insulation layer 36. At this time, in the present embodiment, the N$^+$-type first diffusion region 33 and the second diffusion region 32 are connected by the common anode electrode 39 via the contact holes 37 and 38 as mentioned above. Thus, a diode element as shown in FIG. 1A is completed.

In addition, in the present embodiment, a manufacturing method for only a diode element has been described, however, in other island regions, a vertical PNP transistor element, an NPN transistor element, etc., are formed. In addition to the above, various modifications can be carried out without departing from the scope of the present invention.

What is claimed is:

1. A semiconductor integrated circuit device comprising:
a semiconductor substrate of one conductivity type;
at least one epitaxial layer(s) of the opposite conductivity type deposited on the surface of said substrate;
a opposite-conductivity-type buried layer formed between said substrate and a first epitaxial layer;
a one-conductivity-type buried layer which is formed between said substrate and said first epitaxial layer and is also formed in a manner overlapping with said opposite-conductivity-type buried layer;
a one-conductivity-type buried region which is connected to said one-conductivity-type buried layer and is also connected to a first one-conductivity-type diffusion region formed in an uppermost epitaxial layer;
an opposite-conductivity-type buried region which is connected to said opposite-conductivity-type buried layer and is also connected to a opposite-conductivity-type diffusion region formed in said uppermost epitaxial layer; and
a second opposite-conductivity-type diffusion region which is formed in said uppermost epitaxial layer in a manner surrounded by said first one-conductivity-type diffusion region,
wherein a second one-conductivity-type diffusion region formed in said uppermost epitaxial layer is at least partly overlapped with said first one-conductivity-type diffusion region, and an anode electrode connects said first opposite-conductivity-type diffusion region and said second one-conductivity-type diffusion region.

2. The semiconductor integrated circuit device as set forth in claim 1, wherein
with said second opposite-conductivity-type diffusion region, an opposite-conductivity-type well region is formed from the surface of said uppermost epitaxial layer in an overlapping manner.

3. The semiconductor integrated circuit device as set forth in claim 1, wherein
at least the upper surface of said one-conductivity-type buried layer is located closer to the side of said second opposite-conductivity-type diffusion region than the upper surface of said opposite-conductivity-type buried layer, and the one-conductivity-type buried layer and said second opposite-conductivity-type diffusion region are formed with an interval in the depth direction.

4. The semiconductor integrated circuit device as set forth in claim 1, wherein
said one-conductivity-type buried region is formed in a manner connected with another one-conductivity-type buried layer formed between a plurality of said epitaxial layers.

5. The semiconductor integrated circuit device as set forth in claim 1, wherein
said opposite-conductivity-type buried region is formed in a manner connected with an opposite-conductivity-type buried layer formed between a plurality of said epitaxial layers.

6. A semiconductor integrated circuit device comprising:
a semiconductor substrate of one conductivity type;
a first epitaxial layer of an opposite conductivity type deposited on the surface of said substrate;
a first one-conductivity-type buried layer formed in a manner overlapping with a first opposite-conductivity-type buried layer formed between said substrate and said first epitaxial layer;
a second epitaxial layer of the opposite conductivity type deposited on the surface of said first epitaxial layer;
a second one-conductivity-type buried layer and a second opposite-conductivity-type buried layer formed between said first epitaxial layer and said second epitaxial layer;
a first one-conductivity-type diffusion region formed in a diffusing manner from the surface of said second epitaxial layer to said second one-conductivity-type buried layer;
a first opposite-conductivity-type diffusion region formed in a diffusing manner from the surface of said second epitaxial layer to said second opposite-conductivity-type buried layer,
a second opposite-conductivity-type diffusion region which is formed in said second epitaxial layer in a manner surrounded by said first one-conductivity-type diffusion region,
wherein a second one-conductivity-type diffusion region formed in said second epitaxial layer is at least partly overlapped with said first one-conductivity-type diffusion region, and an anode electrode connects said first opposite-conductivity-type diffusion region and said second one-conductivity-type diffusion region.

7. The semiconductor integrated circuit device as set forth in claim 6, wherein
with said second opposite-conductivity-type diffusion region, an opposite-conductivity-type well region is formed from the surface of said second epitaxial layer in an overlapping manner.

8. A semiconductor integrated circuit device comprising:
a semiconductor substrate of one conductivity type;
a first epitaxial layer of the opposite conductivity type deposited on the surface of said substrate;
a second epitaxial layer of the opposite conductivity type deposited on the surface of said first epitaxial layer;
a first opposite-conductivity-type buried layer which is formed between said substrate and said first epitaxial layer;
a one-conductivity-type buried layer which is formed between said first epitaxial layer and said second epitaxial layer and is formed in a manner at least partly overlapping with said first opposite-conductivity-type buried layer;
a second opposite-conductivity-type buried layer which is formed between said first epitaxial layer and said second epitaxial layer and is partly overlapped with said first opposite-conductivity-type, buried layer;
a first one-conductivity-type diffusion region formed in a diffusing manner from the surface of said second epitaxial layer to said one-conductivity-type buried layer;
a first opposite-conductivity-type diffusion region formed in a diffusing manner from the surface of said second epitaxial layer to said second opposite-conductivity-type buried layer; and
a second opposite-conductivity-type diffusion region which is formed on the surface of said second epitaxial layer in a manner surrounded by said first one-conductivity-type diffusion region, wherein
a second one-conductivity-type diffusion region formed in said second epitaxial layer is at least partly overlapped with said first one-conductivity-type diffusion region, and an anode electrode connects said first opposite-conductivity-type diffusion region and said second one-conductivity-type diffusion region.

9. The semiconductor integrated circuit device as set forth in claim 8, wherein
with said second opposite-conductivity-type diffusion region, an opposite-conductivity-type well region is formed from the surface of said second epitaxial layer in an overlapping manner.

10. A semiconductor integrated circuit device comprising:
a semiconductor substrate of one conductivity type;
at least one epitaxial layer of an opposite conductivity type deposited on the surface of said substrate;
an opposite-conductivity-type buried layer formed between said substrate and a first epitaxial layer;
a one-conductivity-type buried layer which is formed between said substrate and said first epitaxial layer and is also formed in a manner overlapping with said opposite-conductivity-type buried layer;
a one-conductivity-type buried region which is connected to said one-conductivity-type buried layer and is also connected to a one-conductivity-type diffusion region formed in an uppermost epitaxial layer;
an opposite-conductivity-type buried region which is connected to said opposite-conductivity-type buried layer and is also connected to a first opposite-conductivity-type diffusion region formed in said uppermost epitaxial layer; and a second opposite-conductivity-type diffusion region which is surrounded by said one-conductivity-type diffusion region and is formed in said uppermost epitaxial layer, wherein a polycrystalline silicon resistor formed on the surface of said uppermost epitaxial layer is at least partly connected with said one-conductivity-type diffusion region, and an anode electrode connects said first opposite conductivity-type diffusion region and said polycrystalline silicon resistor.

11. The semiconductor integrated circuit device as set forth in claim 10, wherein said anode electrode is connected to a region of said polycrystalline silicon resistor which is not in contact with said one-conductivity-type diffusion region.

12. The semiconductor integrated circuit device as set forth in claim 10, wherein with said second opposite-conductivity-type diffusion region, an opposite-conductivity-type well region is formed from the surface of said uppermost epitaxial layer in an overlapping manner.

* * * * *